(12) United States Patent
Hatano et al.

(10) Patent No.: US 11,201,131 B2
(45) Date of Patent: Dec. 14, 2021

(54) LIGHT EMITTING MODULE

(71) Applicant: NICHIA CORPORATION, Anan (JP)

(72) Inventors: Tomohiko Hatano, Anan (JP); Daisuke Sato, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/748,318

(22) Filed: Jan. 21, 2020

(65) Prior Publication Data

US 2020/0161828 A1 May 21, 2020

Related U.S. Application Data

(63) Continuation of application No. 16/286,022, filed on Feb. 26, 2019, now Pat. No. 10,581,220.

(30) Foreign Application Priority Data

Mar. 1, 2018 (JP) .............................. JP2018-036305
Jul. 31, 2018 (JP) .............................. JP2018-143762

(51) Int. Cl.
*H01L 23/00* (2006.01)
*H01S 5/024* (2006.01)
(Continued)

(52) U.S. Cl.
CPC ............ *H01L 24/72* (2013.01); *H01S 5/0087* (2021.01); *H01S 5/02469* (2013.01); *H01S 5/0425* (2013.01)

(58) Field of Classification Search
CPC .. H01S 5/02469; H01S 5/0425; H01S 5/0232; H01L 23/00
(Continued)

(56) References Cited

U.S. PATENT DOCUMENTS 4,338,577 A * 7/1982 Sato ..................... H01S 5/02212
257/717
6,220,765 B1 * 4/2001 Tatoh ................... H01L 31/0203
257/E31.117
(Continued)

FOREIGN PATENT DOCUMENTS

JP S59-188183 A 10/1984
JP 2004506326 A 2/2004
(Continued)

OTHER PUBLICATIONS

Notice of Allowance of the US continuation U.S. Appl. No. 16/286,022, dated Oct. 28, 2019.

*Primary Examiner* — Tuan N Nguyen
(74) *Attorney, Agent, or Firm* — Global IP Counselors, LLP

(57) ABSTRACT

A light emitting module includes a light emitting device, a heat dissipating plate, and a holder. The light emitting device has a light extraction window and a plurality of electrodes. The light emitting device is secured to the heat dissipating plate. The heat dissipating plate is secured to the holder. The holder includes a plurality of terminals respectively connected to the electrodes of the light emitting device. The heat dissipating plate includes an exposed portion exposed from the holder when viewed from a side of the light emitting module on which the light extraction window of the light emitting device is provided.

20 Claims, 8 Drawing Sheets

(51) Int. Cl.
    *H01S 5/042*     (2006.01)
    *H01S 5/00*     (2006.01)

(58) Field of Classification Search
    USPC .......................................................... 372/36
    See application file for complete search history.

(56) References Cited

U.S. PATENT DOCUMENTS

| | | | | |
|---|---|---|---|---|
| 6,868,105 | B2* | 3/2005 | Yagi | H01S 5/02216 |
| | | | | 372/36 |
| 7,110,425 | B2* | 9/2006 | Yamanaka | H01S 5/4012 |
| | | | | 372/5 |
| 7,200,294 | B2* | 4/2007 | Uchida | G02B 6/4266 |
| | | | | 385/14 |
| 7,317,742 | B2* | 1/2008 | Saito | G02B 6/4292 |
| | | | | 372/34 |
| 8,816,183 | B2* | 8/2014 | Morimoto | F25B 21/02 |
| | | | | 136/204 |
| 9,945,541 | B1* | 4/2018 | Kuo | F21S 45/47 |
| 2003/0147436 | A1 | 8/2003 | Yagi et al. | |
| 2003/0214987 | A1 | 11/2003 | Yamanaka et al. | |
| 2004/0038561 | A1* | 2/2004 | Topp | H01L 23/32 |
| | | | | 439/67 |
| 2011/0101409 | A1* | 5/2011 | Barnett | H01L 25/167 |
| | | | | 257/99 |
| 2012/0007506 | A1 | 1/2012 | Ohmi et al. | |
| 2013/0128489 | A1* | 5/2013 | Satake | H01L 23/10 |
| | | | | 361/820 |
| 2014/0008780 | A1* | 1/2014 | Tsujino | H01L 23/057 |
| | | | | 257/690 |
| 2015/0085262 | A1 | 3/2015 | Ogura | |
| 2017/0110837 | A1* | 4/2017 | Taniguchi | H01R 13/6683 |

FOREIGN PATENT DOCUMENTS

| | | |
|---|---|---|
| JP | 2008-153468 A | 7/2008 |
| JP | 2008-256870 A | 10/2008 |
| JP | 2009-016301 A | 1/2009 |
| JP | 2012-022789 A | 2/2012 |
| JP | 2014-026769 A | 2/2014 |
| JP | 2014-053137 A | 3/2014 |
| JP | 2015-060159 A | 3/2015 |
| JP | 2017-191905 A | 10/2017 |
| JP | 2018153467 A | 10/2018 |

\* cited by examiner

LIGHT EMITTING MODULE

CROSS-REFERENCE TO RELATED APPLICATION

This application is a continuation application of U.S. patent application Ser. No. 16/286,022, filed on Feb. 26, 2019. This application claims priority to Japanese Patent Application No. 2018-036305 filed on Mar. 1, 2018 and Japanese Patent Application No. 2018-143762 filed on Jul. 31, 2018. The entire disclosures of U.S. patent application Ser. No. 16/286,022 and Japanese Patent Application Nos. 2018-036305 and 2018-143762 are hereby incorporated herein by reference.

BACKGROUND

The present invention relates to a light emitting module.

Japanese Patent Application Publication No. 2012-22789 discloses an automotive light which has an LED module provided on the upper face thereof with an anode power feeding part and a cathode power feeding part, a heatsink which dissipates the LED module heat, and an attachment screwed to the heatsink for securing the LED module. The attachment has current-carrying terminals connected to both power feeding parts of the LED module.

Japanese Patent Application Publication No. 2008-153467 and Japanese Patent Application Publication No. 2015-60159 disclose light emitting devices equipped with members which require electricity in addition to light emitting elements. The above mentioned Publication No. 2008-153467 discloses a light emitting module which has a thermistor and a photodiode. The above-mentioned Publication No. 2015-60159 discloses a fluorescent light emitting device which includes fine conductive wiring disposed on a phosphor plate which is subjected to laser beam irradiation from a laser element.

SUMMARY

The automotive light disclosed in the above-mentioned Publication No. 2012-22789 has only two power feeding parts which correspond to the anode and the cathode of the LED. However, as described in the above-mentioned Publication Nos. 2008-153467 and 2015-60159, for example, there are instances where a light emitting device has a member other than a light emitting element which requires electrodes. In the case of using such a light emitting device, a suitable holder is required.

A light emitting module according to one aspect includes a light emitting device, a heat dissipating plate, and a holder. The light emitting device has a light extraction window and a plurality of electrodes. The light emitting device is secured to the heat dissipating plate. The heat dissipating plate is secured to the holder. The holder includes a plurality of terminals respectively connected to the electrodes of the light emitting device. The heat dissipating plate includes an exposed portion exposed from the holder when viewed from a side of the light emitting module on which the light extraction window of the light emitting device is provided.

A light emitting module according to another aspect includes a light emitting device, a heat dissipating plate, and a holder. The light emitting device has a light extraction window and a plurality of electrodes. The light emitting device is secured to an upper face of the heat dissipating plate. The heat dissipating plate is secured to a lower face of the holder. The holder includes a plurality of terminals respectively connected to the electrodes of the light emitting device. The heat dissipating plate includes an exposed portion exposed from the holder in a top plan view.

According to the aspects of the disclosure described above, a light emitting module capable of facilitating miniaturization can be provided.

DETAILED DESCRIPTION

Figure 1:
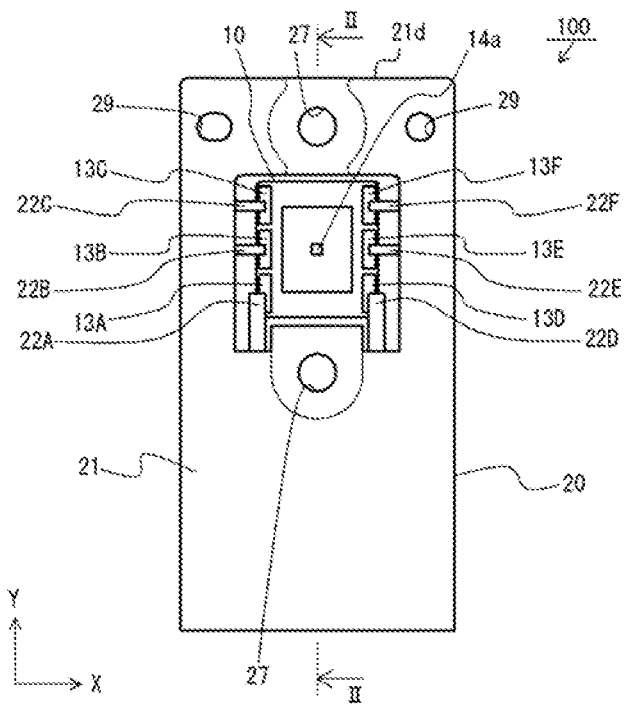
FIG. 1 is a schematic plan view of a light emitting module according to Embodiment 1.

Certain embodiments of the present invention will be explained below with reference to the accompanying drawings. The embodiments described below, however, are for illustrating ways to give shape to technical ideas of the present invention, and are not intended to limit the present invention to the embodiments described below. Furthermore, in the explanations below, the same designations and reference numerals show the same or similar members for which detailed explanations will be omitted when appropriate.

Embodiment 1

Figure 2:
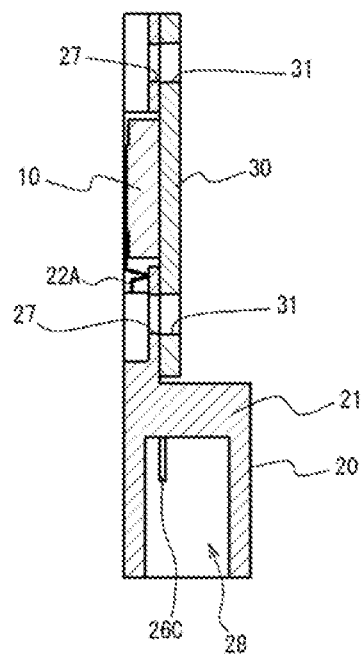
FIG. 2 is a schematic cross-sectional view taken along line II-II in FIG. 1.
Figure 3:
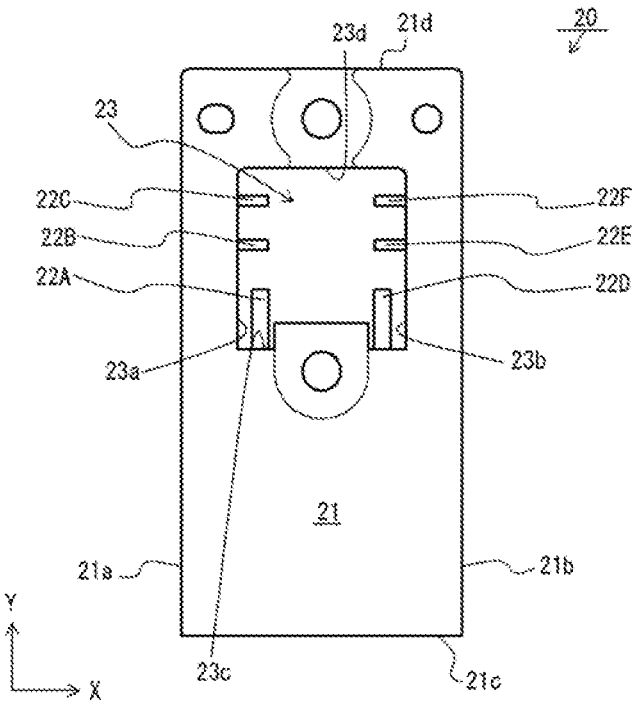
FIG. 3 is a schematic plan view of a holder according to Embodiment 1.
Figure 4:
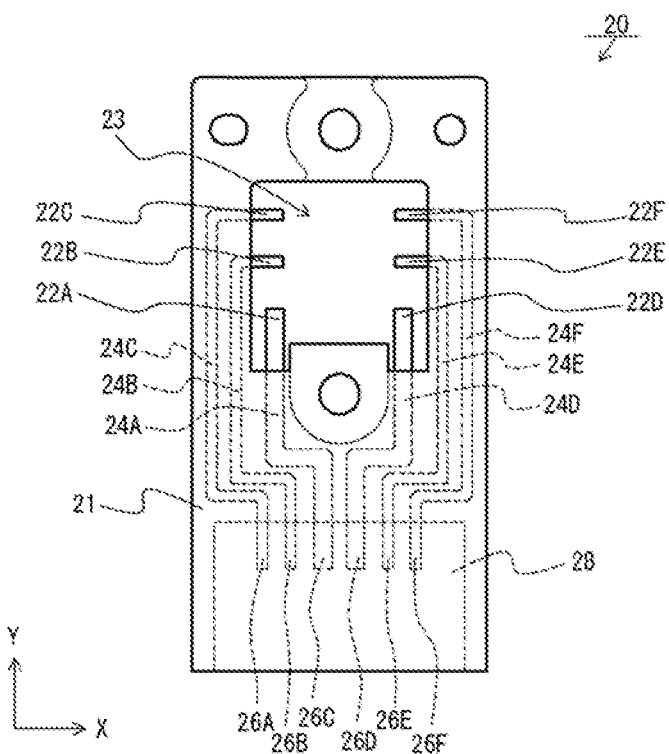
FIG. 4 is a schematic plan view of the first wire to the sixth wire, the first connection end to the sixth connection end, and the connector shown through the body of the holder.
Figure 5:
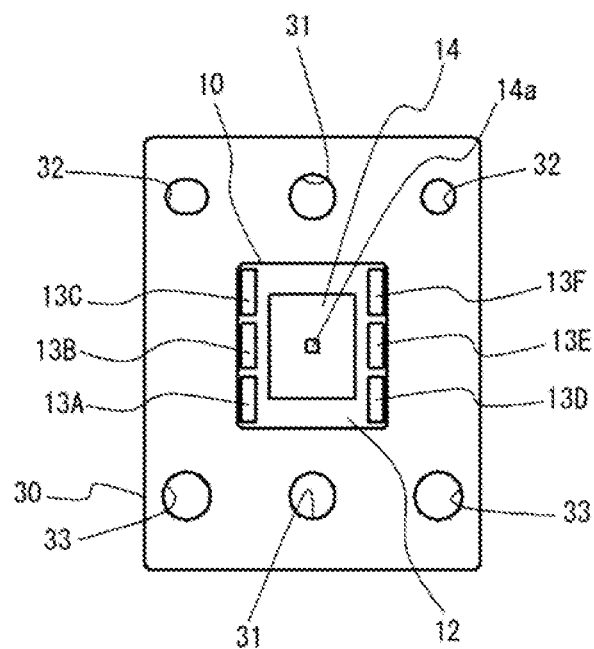
FIG. 5 is a schematic plan view of a light emitting device and a heat dissipating plate according to Embodiment 1.
Figure 6:
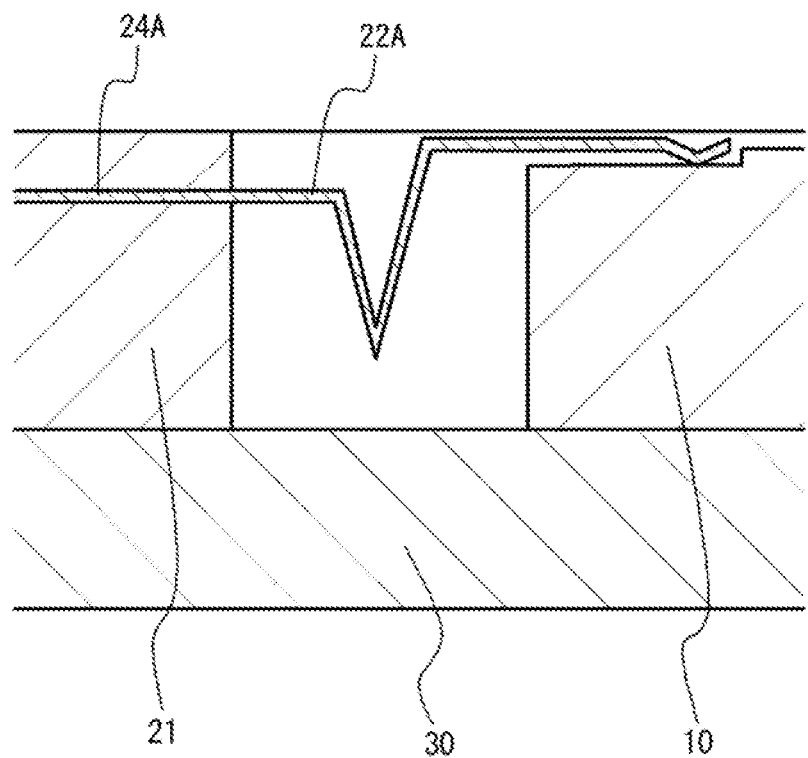
FIG. 6 is a schematic cross-sectional view of the first terminal and its vicinity.

FIG. 1 is a schematic plan view of a light emitting module 100 according to Embodiment 1, FIG. 2 is a schematic cross-sectional view taken along line II-II in FIG. 1. FIG. 3 is a schematic plan view of a holder 20 according to Embodiment 1. FIG. 4 is a schematic plan view of the first wire 24A to the sixth wire 24F, the first connection end 26A to the sixth connection end 26F, and the connector 28 shown through the body 21. FIG. 5 is a schematic plan view of a light emitting device 10 and a heat dissipating plate 30 according to Embodiment 1. FIG. 6 is a schematic cross-sectional view of the first terminal 22A and its vicinity.

As shown in FIG. 1 to FIG. 6, the light emitting module 100 according to Embodiment 1 has a light emitting device 10 and a holder 20. The light emitting device 10 has a light emitting element 11, a package body 12 on which the light emitting element 11 is disposed, and a plurality of electrodes 13A to 13F. The holder 20 has an insulator body 21 and a plurality of terminals 22A to 22F. The body 21 is provided with an opening 23 in which the light emitting device 10 is disposed, in a plan view. When the light emitting device 10 is disposed in the opening 23, the light emitting device 10 is entirely surrounded by the body 21 in a plan view. The opening 23 has a first inner edge 23a, a second inner edge 23b, a third inner edge 23c, and a fourth inner edge 23d. The first inner edge 23a and the second inner edge 23b are positioned to interpose the light emitting device 10. The third inner edge 23c and the fourth inner edge 23d are positioned to interpose the light emitting device 10, and are each connected to the first inner edge 23a and the second inner edge 23b.

The first electrode 13A, the second electrode 13B, and the third electrode 13C of the light emitting device 10 are successively disposed on the first inner edge 23a side to be more distant from the third inner edge 23c. The fourth electrode 13D, the fifth electrode 13E, and the sixth electrode 13F are successively disposed on the second inner edge 23b side to be more distant from the third inner edge 23c. The first terminal 22A projects from the third inner edge 23c and is connected to the first electrode 13A. The second terminal 22B projects from the first inner edge 23a and is connected to the second electrode 13B. The third terminal 22C projects from the first inner edge 23a and is connected to the third electrode 13C. The fourth terminal 22D projects from the third inner edge 23c and is connected to the fourth electrode 13D. The fifth terminal 22E projects from the second inner edge 23b and is connected to the fifth electrode 13E. The sixth terminal 22F projects from the second inner edge 23b and is connected to the sixth electrode 13F.

The holder 20 shown in FIG. 1 to FIG. 4 has a first wire 24A, a second wire 24B, a third wire 24C, a fourth wire 24D, a fifth wire 24E, and a sixth wire 24F which are held by the body 21. The portion of the first wire 24A that projects into the opening 23 is the first terminal 22A. Similarly, the portions of the second wire 24B to the sixth wire 24F that project into the opening 23 are the second terminal 22B to the sixth terminal 22F, respectively. The body 21, as shown in FIG. 3, has a first outer edge 21a, a second outer edge 21b, a third outer edge 21c, and a fourth outer edge 21d that define the outer edges of the body 21 in a plan view. The first outer edge 21a to the fourth outer edge 21d are disposed essentially in parallel to the first inner edge 23a to the fourth inner edge 23d, respectively. In the drawings such as FIG. 1, it is assumed that the direction in which the first inner edge 23a and the second inner edge 23b are connected in the shortest distance is the first direction X, and the direction in which the third inner edge 23c and the fourth inner edge 23d are connected in the shortest distance is the second direction Y.

Among the six terminals in the light emitting module 100, two of the terminals project from the first inner edge 23a, other two of the terminals project from the second inner edge 23b, and other two of the terminals project from the third inner edge 23c. With this layout, the width of the light emitting module 100 in the first direction X can be reduced as compared to the case in which three of the six terminals project from the first inner edge 23a and the other three from the second inner edge 23b. In other words, projecting all of the first terminal 22A to the third terminal 22C from the first inner edge 23a would require all of the first wire 24A to the third wire 24C which correspond to the first terminal 22A to the third terminal 22C to be disposed between the first inner edge 23a and the first outer edge 21a. In contrast, as shown in FIG. 1 to FIG. 4, projecting the first terminal 22A from the third inner edge 23c instead of the first inner edge 23a eliminates the need for disposing the first wire 24A which corresponds to the first terminal 22A between the first inner edge 23a and the first outer edge 21a. This can reduce the width of the light emitting module 100 in the first direction X. In the case of employing a plurality of such light emitting modules 100, moreover, the light emitting devices 10 can be positioned close to one another by arranging the light emitting modules 100 in the first direction X.

Light Emitting Module

The light emitting module 100 can be used as a light source in various applications, such as projectors, store lighting, and street lights, besides a light source for an automotive headlight.

Light Emitting Device

As shown in FIG. 1 and FIG. 5, the light emitting device 10 has a light extraction window 14a through which the light from the light emitting element 11 passes. In the description herein, the face of the light emitting device 10 having the light extraction window 14a is assumed as the upper face of the light emitting device 10, and the opposite face of the light emitting device 10 is assumed as the lower face of the light emitting device 10. As shown in FIG. 1 to FIG. 4, the light extraction window 14a can be disposed at the mid-position between the first inner edge 23a and the second inner edge 23b. The first electrode 13A to the third electrode 13C are arranged on one side, and the fourth electrode 13D to the sixth electrode 13F are arranged on the other side of the light extraction window 14a opposing the side in which the first electrode 13A to the third electrode 13C are arranged.

The first electrode 13A can be paired with the fourth electrode 13D. The second electrode 13B can be paired with the fifth electrode 13E. The third electrode 13C can be paired with the sixth electrode 13F. Each of these electrode pairs can be disposed at opposing positions in the first direction X. The first electrode 13A to the sixth electrode 13F can all have the same shape and size, for example.

The first electrode 13A and the fourth electrode 13D are preferably used as the energizing electrodes for the light emitting element 11. In other words, either the anode or the cathode of the light emitting element 11 is preferably electrically connected to the first electrode 13A while the other is electrically connected to the fourth electrode 13D. As described later, because the first terminal 22A and the fourth terminal 22D respectively connected to the first electrode 13A and the fourth electrode 13D can have a larger width than the other terminals, they can carry a larger electric current than the other terminals. Accordingly, using the first electrode 13A and the fourth electrode 13D as the energizing electrodes for the light emitting element 11 can supply a larger electric current to the light emitting element 11.

The second electrode 13B and the fifth electrode 13E can be used as the energizing electrodes for a first member. The third electrode 13C and the sixth electrode 13F can be used as the energizing electrodes for a second member. Examples of the first member and the second member include, for example, a thermistor, photodiode, and the like. Alternatively, the first member or the second member can be a detection wire which will be disconnected when a wavelength conversion member or the like becomes damaged or detached. Providing a detection wire allows for the detection of damage or detachment of a wavelength conversion member or the like. The electric current flowing to the light emitting element 11 can be cut off due to such detection, so that the light is turned off.

In the case of individually energizing the light emitting element 11, the first member, and the second member, separate electrodes are used for individually energizing them. Electrodes can be shared if individual energization is unnecessary. In this case, the number of electrodes for the light emitting device 10 can be reduced, or another member which requires energization can be added while maintaining the same number of electrodes.

Figure 7:
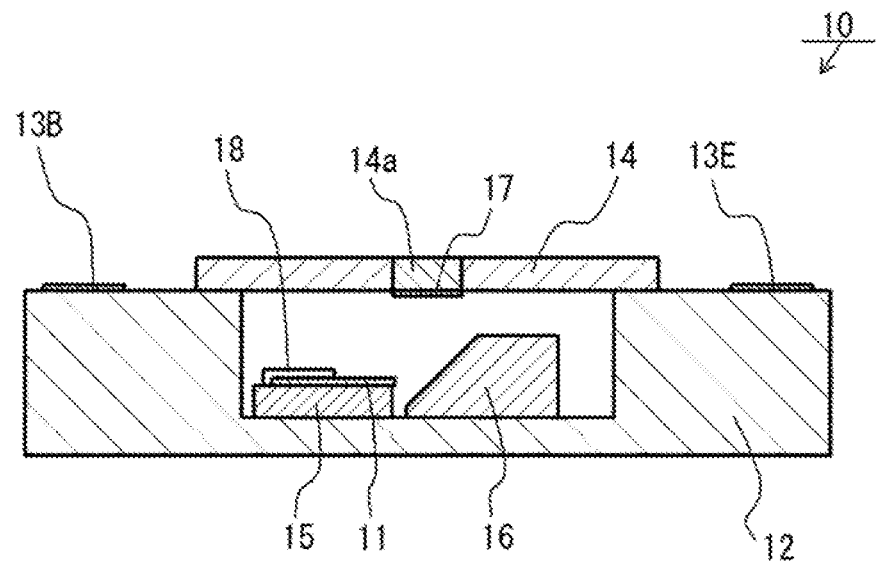
FIG. 7 is a schematic cross-sectional view of the light emitting device according to Embodiment 1.

FIG. 7 shows an example of the light emitting device 10. The light emitting device 10 has a package body 12 which has a recess, and a cover 14 bonded to the upper face of the package body 12. The light emitting element 11 is placed in the sealed space enclosed by the package body 12 and the cover 14. The light emitting element 11 is secured to the upper surface of the bottom side in the recess of the package body 12 via the submount 15. The light emitting element 11 is, for example, a semiconductor laser element, and the light emitted by the light emitting element 11 is reflected by the reflecting member 16 and extracted from the light emitting device 10 through the light extraction window 14a of the cover 14. The light emitting device 10 has a detection wire 17 as the first member, and a thermistor 18 as the second member. The detection wire 17 is disposed on the surface of the light extraction window 14a. The thermistor 18 is disposed in the sealed space enclosed by the package body 12 and the cover 14. The detection wire 17 is electrically connected to the second electrode 13B and the fifth electrode 13E. The thermistor 18 is electrically connected to the third electrode 13C and the sixth electrode 13F.

The light emitting device 10 has one or more light emitting elements 11. The light emitting element 11 may be directly mounted on the package body 12. The light emitting element 11 can be a semiconductor laser element. By using the first electrode 13A and the fourth electrode 13D as the energizing electrodes for the light emitting element 11, a high output semiconductor laser element requiring a relatively large electric current can be employed as the light emitting element 11. For example, a semiconductor laser element having an output of 1W or higher is used for the light emitting element 11. Examples of semiconductor laser elements include those having an active layer made of a nitride semiconductor. When using such a semiconductor laser element, it is preferable to hermetically seal the space because the emitted laser beam readily collects dust. That is, the sealed space enclosed by the package body 12 and the cover 14 is preferably a hermetically sealed space. Examples of nitride semiconductors include group III-V semiconductors such as $Al_xIn_yGa_{1-x-y}N$ ($0 \leq x \leq 1$, $0 \leq y \leq 1$, $0 \leq x+y \leq 1$).

The body 21, for example, is made primarily of a ceramic material, such as aluminum oxide, aluminum nitride, silicon nitride, silicon carbide, or the like. On the interior of the body 21, there is disposed a conductive layer to be electrically connected to the light emitting element 11. The first electrode 13A and the fourth electrode 13D will be electrically connected to the light emitting element 11 by being electrically connected to the conductive layer. The cover 14 has a light extraction window 14a through which the light from the light emitting element 11 passes. The light extraction window 14a in part or whole may be a wavelength conversion member containing a YAG phosphor or the like.

Holder

The holder 20 is a member provided for supplying power to the light emitting device 10. The holder 20 has an insulator body 21. The body 21 is made of, for example, a resin. The opening 23 of the body 21 is, for example, square shaped. The third inner edge 23c of the opening 23, as shown in FIG. 3, may have a projected portion which projects towards the center of the opening 23 between the first terminal 22A and the fourth terminal 22D. Providing such a projected portion facilitates the disposition of a through hole 27. The first inner edge 23a and the second inner edge 23b can each be, for example, straight-line shaped. The holder 20 has a first terminal 22A to a sixth terminal 22F. The first terminal 22A to the sixth terminal 22F are each made of, for example, a metal.

The first terminal 22A to the sixth terminal 22F are connected to the first electrode 13A to the sixth electrode 13F, respectively. The first terminal 22A preferably has the flexibility to press the first electrode 13A downwards. This can securely connect the first terminal 22A and the first electrode 13A. The first terminal 22A can have, for example, a leaf spring shape. Similarly, the second terminal 22B to the sixth terminal 22F preferably have the flexibility to press the second electrode 13B to the sixth electrode 13F downwards, and are, for example, leaf-spring shaped. Alternatively, the first terminal 22A to the sixth terminal 22F and the first electrode 13A to the sixth electrode 13F may be respectively connected by using solder, conductive adhesive, or the like.

As shown in FIG. 1 to FIG. 4, the width of the first terminal 22A can be larger than the widths of the second terminal 22B and the third terminal 22C. As shown in FIG. 1 to FIG. 4, because the second terminal 22B and the third terminal 22C project from the first inner edge 23a, their widths need to be narrow enough so as not to come into contact with one another. Because the first terminal 22A is projecting from the third inner edge 23c, it can have a larger width than the second terminal 22B and the third terminal 22C. Similarly, the fourth terminal 22D can have a larger width than the fifth terminal 22E and the sixth terminal 22F. Having a wider width as described above, the first terminal 22A and the fourth terminal 22D can carry a larger electric current than the other terminals. Accordingly, it is preferable to use the first terminal 22A and the fourth terminal 22D as the energizing terminals for the light emitting element 11.

As for the lengths of the portions projecting into the opening 23, as shown in FIG. 1 to FIG. 4, the first terminal 22A is preferably longer than both the second terminal 22B and the third terminal 22C. In the case of a leaf spring terminal, the amount of displacement of the terminal changes in accordance with the load applied and the material, thickness, length, width, or the like of the terminal. For this reason, the longer the terminal, the larger the amount of displacement will result when the other parameters remain the same. Accordingly, increasing the length of the first terminal 22A can more definitively allow the first terminal 22A to come into contact with the first electrode 13A. Furthermore, the wider the width of a terminal, the smaller the amount of displacement will result when the other parameters remain the same. For this reason, if the first terminal 22A is wider than the second terminal 22B and the third terminal 22C, in particular, it is preferable to increase the length of the first terminal 22A. Because this can increase the amount of displacement of the first terminal 22A, the first terminal 22A is allowed to more definitively come into contact with the first electrode 13A. Similarly, the fourth terminal 22D is preferably longer than both the fifth terminal 22E and the sixth terminal 22F. The length of the projected portion of each terminal refers to the length of a virtual line connecting the start point, which is the edge of the opening 23 for each terminal, and the end point, which is the position of contact with the respective electrode of the light emitting device 10. For example, in FIG. 3, the length of the portion of the first terminal 22A projecting into the opening 23, i.e., the length of the first terminal 22A projecting from the third inner edge 23c, is the length of the first terminal 22A in the second direction Y. The length of the portion of the second terminal 22B projecting into the opening 23, i.e., the length of the second terminal 22B projecting from the first inner edge 23a, is the length of the second terminal 22B in the first direction X.

The first terminal 22A to the sixth terminal 22F, as shown in FIG. 6, may each be shaped to have bent portions between the body 21 and the light emitting device 10. Providing such bent portions is considered beneficial when employing the light emitting module 100 in applications which involve vibrations such as automotive headlights. That is because the bent portions can absorb such vibrations to make it less likely for the tips of the first terminal 22A to the sixth terminal 22F to be disconnected from the first electrode 13A to the sixth electrode 13F.

The holder 20 can have a connector 28 for energizing the first terminal 22A to the sixth terminal 22F. The other ends of the first wire 24A to the sixth wire 24F respectively connected to the first terminal 22A to the sixth terminal 22F are located at the connector 28. In other words, one end of each of the first wire 24A to the sixth wire 24F is the first terminal 22A to the sixth terminal 22F, respectively, and the other end of each of them are the first connection end 26A, the second connection end 26B, the third connection end 26C, the fourth connection end 26D, the fifth connection end 26E, and the sixth connection end 26F that are exposed from the insulator body 21 at the connector 28. The first wire 24A may be formed as one continuous part from the first terminal 22A to the first connection end 26A, and can be formed, for example, with a piece of sheet metal. The second wire 24B to the sixth wire 24F may be formed in a similar manner.

The holder 20, as shown in FIG. 1 to FIG. 4, can have a shape that is elongated in the direction connecting the third inner edge 23c and the fourth inner edge 23d, i.e., the second direction Y. In this case, the connector 28 is preferably positioned at one end of the holder 20 in the direction connecting the third inner edge 23c and the fourth inner edge 23d. This can lessen the amount of increase in the width of the light emitting module 100, i.e., the width in the first direction X. As described later, in the case where the first terminal 22A and the fourth terminal 22D are larger in width than the other terminals, it is preferable for the first wire 24A and the fourth wire 24D to similarly be larger in width than the other wires.

Furthermore, in the case where the connector 28 has a socket shape as shown in FIG. 2, i.e., in the case where the body 21 has a recess in which the first connection end 26A to the sixth connection end 26F are disposed, the connector 28 is preferably open towards the second direction Y. Because this allows for the arrangement of light emitting modules 100 in the first direction X if multiple modules were to be used, the light emitting devices 10 can be arranged close to one another. The connector 28 may be open towards the bottom. This can achieve a similar effect.

The holder 20 may be provided with through holes 27 for screw tightening. As shown in FIG. 1 to FIG. 4, the holder 20 is preferably provided with a pair of through holes 27 for screw tightening created at the positions that interpose the light emitting device 10 in the direction connecting the third inner edge 23c and the fourth inner edge 23d, i.e., the second direction Y. This can lessen the amount of increase in the width of the holder 20 in the first direction X. As shown in FIG. 1, the holder 20 may be further provided with through holes 29. The positioning pins disposed on the heatsink 40 or the like described later can be inserted into the through holes 29.

Heat Dissipating Plate

As shown in FIG. 2, the light emitting module 100 can have a heat dissipating plate 30. The heat dissipating plate 30 can have the function of transferring the heat from the light emitting device 10 to a heatsink 40 or the like. Examples of the materials for the heat dissipating plate 30 include metals, ceramics, resins, or the materials combining these. It is preferable to form the heat dissipating plate 30 using as a primary material a metal, such as Cu and Al, or a ceramic material, such as AlN or the like, so that it can dissipate the heat generated by the light emitting device 10. One made of such a primary material provided on the surface thereof with an insulator layer or a metal layer may alternatively be used as the heat dissipating plate 30. Besides these, an insulator substrate made of a resin or the like combined with a metal material member may be used as the heat dissipating plate 30 while disposing the light emitting device 10 directly on the metal material member. A heat dissipating sheet, heat dissipating grease, or adhesive can be disposed between the light emitting device 10 and the heat dissipating plate 30. The light emitting device 10 is preferably secured to the heat dissipating plate 30. This eliminates the need to provide the holder 20 with the structure of directly securing the light emitting device 10, thereby enabling miniaturization of the holder 20.

As shown in FIG. 5, the center of the heat dissipating plate 30 can be aligned with the center of the light emitting device 10 in a plan view. For example, by disposing solder, resin adhesive or the like between the lower face of the light emitting device 10 and the upper face of the heat dissipating plate 30, the light emitting device 10 can be secured to the heat dissipating plate 30. It is preferable for a resin adhesive to contain a filler having a high thermal conductivity, such as Ag, Al, alumina, or the like. This facilitates the heat transfer from the light emitting device 10 to the heat dissipating plate 30 via the resin adhesive.

The heat dissipating plate 30 is preferably secured to the holder 20. This can fix the relative positions of the heat dissipating plate 30 and the holder 20, i.e., the relative positions of the light emitting device 10 and the holder 20. Accordingly, in securing the holder 20 to the heatsink 40 or the like, it is unnecessary to realign the light emitting device 10 because the light emitting device 10 can be secured at a desired position by aligning the holder 20. Examples of methods for securing the heat dissipating plate 30 to the holder 20 include disposing engaging parts such as claws at least on the heat dissipating plate 30 or the holder 20 to secure one to the other. An adhesive such as a resin may alternatively be used. Alternatively, the holder 20 may be screwed to the heatsink 40 and the heat dissipating plate 30 may be secured to the holder 20 by being held between them.

The heat dissipating plate 30 preferably has through holes 31 corresponding to the through holes 27. This allows the heat dissipating plate 30 to be screw-tightened together when the holder 20 is screwed to the heatsink 40 or the like. A total of two through holes 31 for screw tightening can be provided so as to interpose the light emitting device 10 in a plan view. As shown in FIG. 5, when the outer shape of the heat dissipating plate 30 is a rectangle, for example, the two through holes 31 are preferably positioned on the line that connects the central points of two opposing sides rather than on a diagonal line of the outer shape of the heat dissipating plate 30. This can reduce the shortest distance from either of the two through holes 31 to the outer edge of the heat dissipating plate 30 which will likely prevent the outer edges of the heat dissipating plate 30 from being separated from the holder when screw tightened. The heat dissipating plate 30, moreover, may have through holes 32 disposed in the positions corresponding to the through holes 29 of the holder 20. The heat dissipating plate 30 may have through holes 33 into which the positioning pins for positioning the holder 20 will be inserted.

Heatsink

Figure 8:
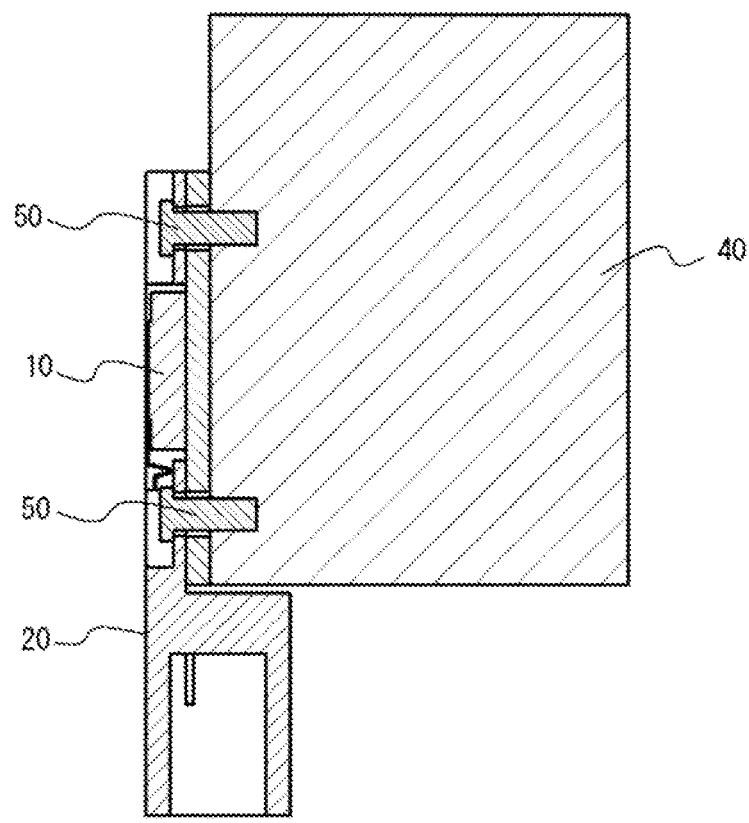
FIG. 8 is a schematic cross-sectional view of the holder secured to the heatsink.

As shown in FIG. 8, the light emitting module 100 may further have a heatsink 40. In FIG. 8, the holder 20 is secured to the heatsink 40 by the screws 50 screwed in the through holes 27. The heat from the light emitting module 100 can be dissipated by the heatsink 40. A heat dissipating sheet, grease, or the like may be disposed between the heatsink 40 and the light emitting module 100.

Variation

In the light emitting module 100 shown in FIG. 1 and FIG. 2, the light emitting device 10 has six electrodes, but the number of electrodes of the light emitting device may be increased or decreased. In the case where a through screw hole 27 is provided near the third inner edge 23c, the number of terminals projecting from the third inner edge 23c is preferably less than or the same as the number of terminals projecting from the first inner edge 23a or the second inner edge 23b. This can lessen the increase in the width of the body 21 while securing an area for the through hole 27.

Figure 9:
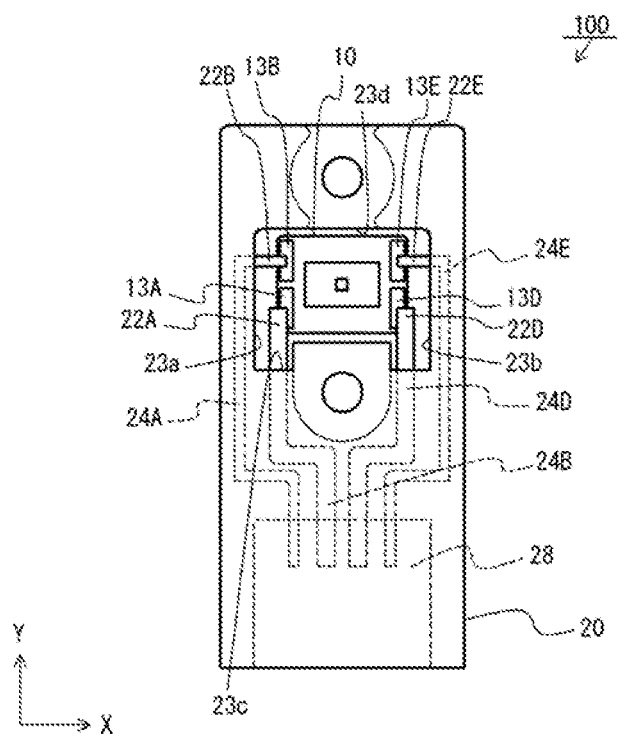
FIG. 9 is a schematic plan view of Variation 1 of the light emitting module.

For example, in the case where the number of electrodes of the light emitting device 10 is four as shown in FIG. 9, the layout can be one in which the third electrode 13C, the sixth electrode 13F, the third terminal 22C, and the sixth terminal 22F are omitted. In other words, the light emitting device 10 has at least two first side electrodes including a first electrode 13A and a second electrode 13B, and at least two second side electrodes including a fourth electrode 13D and a fifth electrode 13E. The first terminal 22A (a third inner edge terminal) projects from the third inner edge 23c and is connected to the first electrode 13A. The second terminal 22B (a first inner edge terminal) projects from the first inner edge 23a and is connected to the second electrode 13B. The fourth terminal 22D (a third inner edge terminal) projects from the third inner edge 23c and is connected to the fourth electrode 13D. The fifth terminal 22E (a second inner edge terminal) projects from the second inner edge 23b and is connected to the fifth electrode 13E.

Embodiment 2

Figure 10:
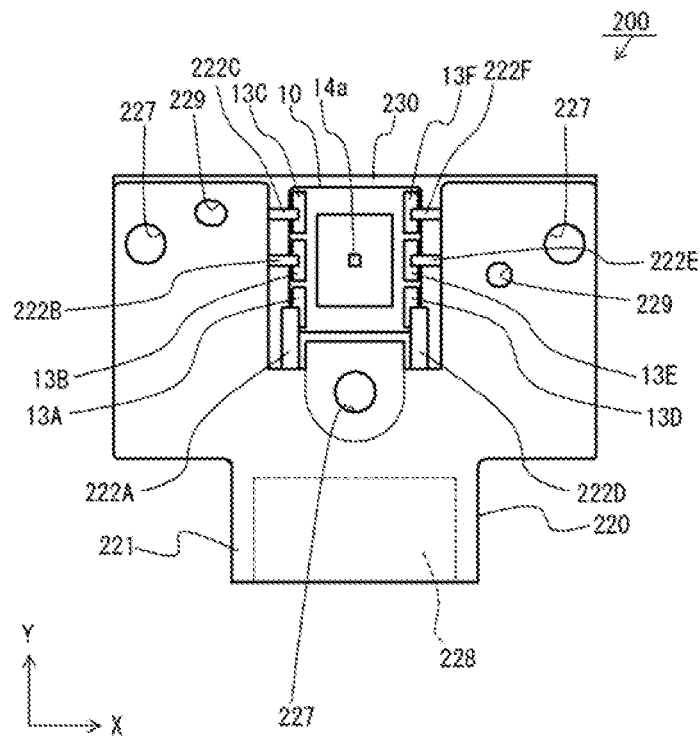
FIG. 10 is a schematic plan view of a light emitting module according to Embodiment 2.
Figure 11:
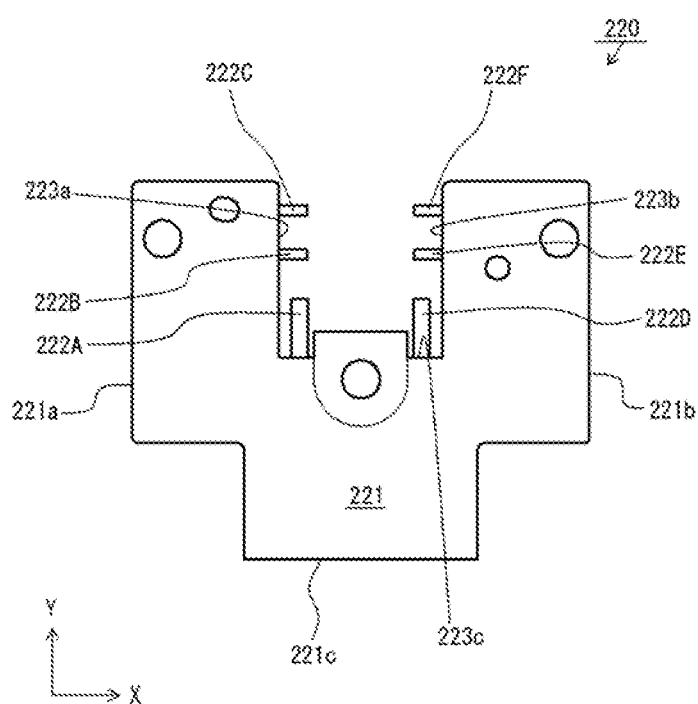
FIG. 11 is a schematic plan view of a holder according to Embodiment 2.

FIG. 10 is a schematic plan view of the light emitting module 200 according to Embodiment 2. The schematic plan view depicts the holder 220 according to Embodiment 2. As shown in FIG. 10 and FIG. 11, the light emitting module 200 according to Embodiment 2 differs from the light emitting module 100 according to Embodiment 1 in the three particulars discussed below. That is, the insulator body 221 has no opening or the fourth inner edge; the through holes 227 for screw tightening and the through holes 229 for positioning pin insertion are provided on the left and the right sides of the light emitting device 10 in the schematic diagram; and the shapes of the body 221 and the heat dissipating plate 230 are different accordingly. In Embodiment 2, the members denoted with the same numerical references show essentially the same members. In Embodiment 2, moreover, the members having the same designations as, but different numerical references from, those of Embodiment 1 are essentially the same as those of Embodiment 1 other than the differences described above.

The light emitting module 200 has a light emitting device 10 and a holder 220. The holder 220 has an insulator body 221, and a plurality of terminals 222A to 222F. The body 221 has a recess defined by an open space in which the light emitting device 10 is disposed, and this allows the light emitting device 10 to be partially surrounded by the body 221 in a plan view. The body 221 has a first inner edge 223a, a second inner edge 223b, and a third inner edge 223c. The first inner edge 223a and the second inner edge 223b are positioned to interpose the light emitting device 10. The third inner edge 223c connects the first inner edge 223a and the second inner edge 223b.

The first electrode 13A, the second electrode 13B, and the third electrode 13C of the light emitting device 10 are successively disposed on the first inner edge 223a side to be more distant from the third inner edge 223c. The fourth electrode 13D, the fifth electrode 13E, and the sixth electrode 13F are successively disposed on the second inner edge 223b side to be more distant from the third inner edge 223c. The first terminal 222A projects from the third inner edge 223c and is connected to the first electrode 13A. The second terminal 222B projects from the first inner edge 223a and is connected to the second electrode 13B. The third terminal 222C projects from the first inner edge 223a and is connected to the third electrode 13C. The fourth terminal 222D projects from the third inner edge 223c and is connected to the fourth electrode 13D. The fifth terminal 222E projects from the second inner edge 223b and is connected to the fifth electrode 13E. The sixth terminal 222F projects from the second inner edge 223b and is connected to the sixth electrode 13F.

The body 221, as shown in FIG. 11, has a first outer edge 221a, a second outer edge 221b, and a third outer edge 221c that define the outer edges in a plan view. The first outer edge 221a to the third outer edge 221c are disposed essentially in parallel to the first inner edge 223a to the third inner edge 223c, respectively. The holder 220 has a connector 228 to energize the first terminal 222A to the sixth terminal 222F. The other ends of the first wire to the six wire respectively connected to the first terminal 222A to the sixth terminal 222F are located at the connector 228. The first wire to the sixth wire are spaced apart from one another so as not to be electrically connected on the inside of the body 221. The connector 228 is disposed so that the third inner edge 223c is positioned between the connector 228 and the light emitting device 10. As shown in FIG. 10, the light emitting device 10, the third inner edge 223c, and the connector 228 may be arranged on a straight line along the second direction Y.

In the light emitting module 200, the length of the body 221 in the first direction X is larger at the connector 228 and in the surrounding area than the area that surrounds the light emitting device 10. For this reason, through holes 227 and through holes 229 can be easily disposed between the first outer edge 221a and the first inner edge 223a, and between the second outer edge 221b and the second inner edge 223b, respectively. With such a layout, a pair of through holes 227 and a pair of through holes 229 can be disposed at the locations that interpose the light emitting device 10. This has the advantage of easily securing the light emitting device 10. Through holes are also created in the heat dissipating plate 30 at the positions that correspond to the through holes 227 and the through holes 229. In FIG. 10 and FIG. 11, the first direction X is the direction in which the first inner edge 223a and the second inner edge 223b are connected in the shortest distance, and the second direction Y is perpendicular to the first direction X while intersecting with the third inner edge 223c.

Among the six terminals in the light emitting module 200, two of the terminals project from the first inner edge 223a, other two project from the second inner edge 223b, and other two project from the third inner edge 223c. This can achieve a similar effect to that achieved by the light emitting module 100 of Embodiment 1. The light emitting module 200, unlike the light emitting module 100, has no fourth inner edge, and thus a portion of the light emitting device 10 (one outer edge of the light emitting device in FIG. 10) is not surrounded by the body 221. In this manner, the light emitting module 200 allows another member to be disposed closer to the light emitting device 10 as compared to the light emitting module 100. For the light emitting module 200 according to Embodiment 2, the number of electrodes may be reduced as in the case of the variation discussed above and shown in FIG. 9, or increased.

Figure 12:
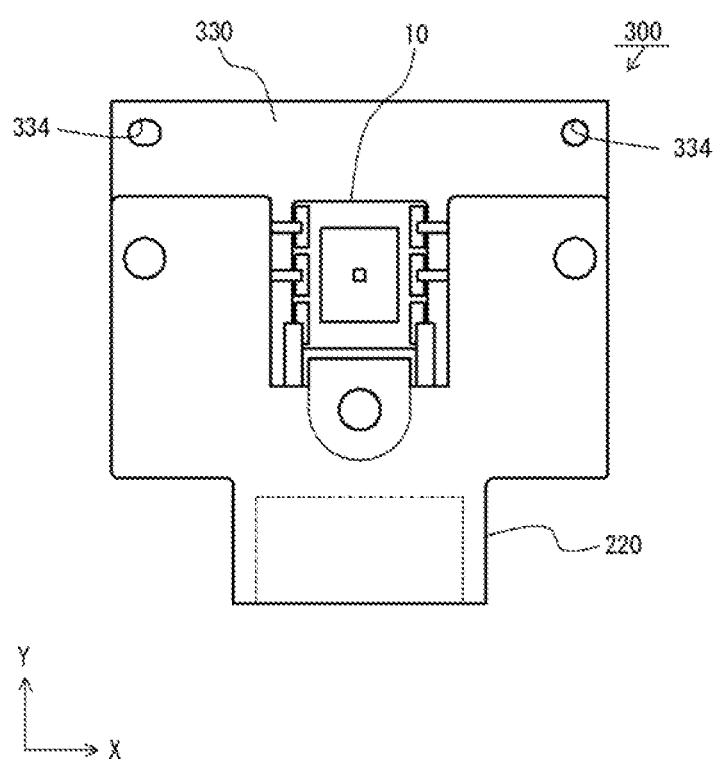
FIG. 12 is a schematic plan view of Variation 2 of the light emitting module.
Figure 13:
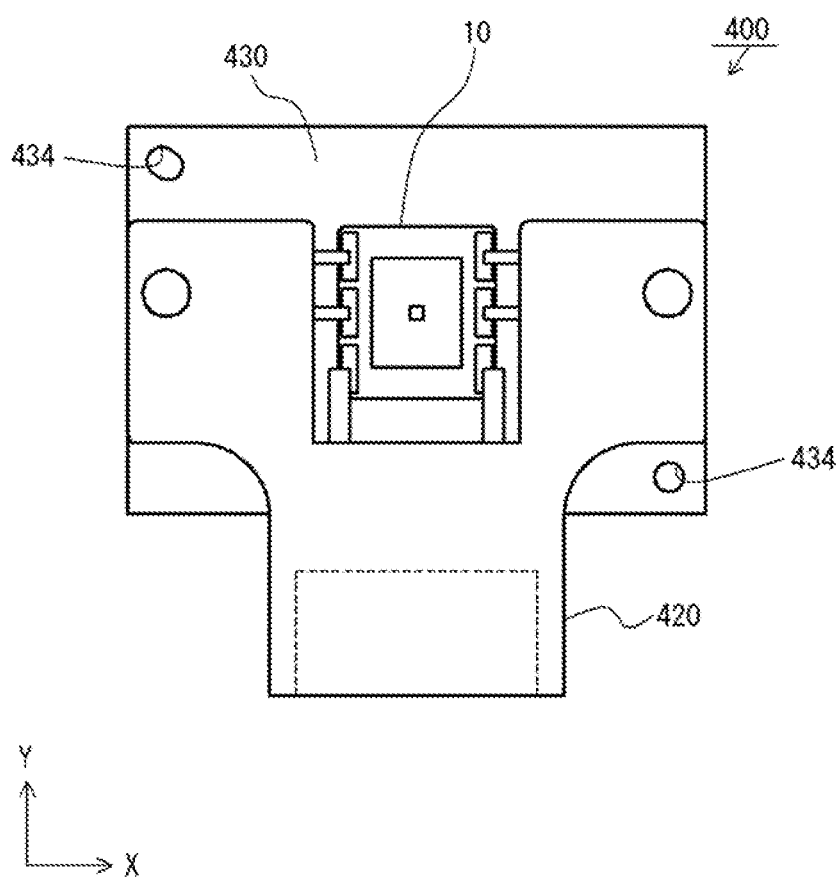
FIG. 13 is a schematic plan view of Variation 3 of the light emitting module.

FIG. 12 and FIG. 13 show variations of the light emitting module. In the case of the light emitting module 300 shown in FIG. 12, a portion of the heat dissipating plate 330 is exposed from the holder 220, and a pair of through holes 334 is provided in the exposed portion. Positioning pins formed on a heatsink or the like can be inserted into the pair of through holes 334. The light emitting module 400 shown in FIG. 13 is the same as the light emitting module 300 in FIG. 12 with respect to that the heat dissipating plate 430 are exposed from the holder 420, and a pair of through holes 434 is provided in the exposed portions. The pair of through holes 434, unlike the pair of through holes 334, is disposed at the positions that interpose the holder 420. The holder 420 is similar to the holder 220 except for the shape, and the two through holes provided. As described above, the heat dissipating plate 330 (or 430) may be partially exposed from the holder 220 (or 420). This allows for a component other than the light emitting device 10 to be secured to an exposed portion of the heat dissipating plate 330.

What is claimed is:

1. A light emitting module comprising:
   a light emitting device including
   a package defining a sealed space, and provided with a light extraction window,
   a light emitting element disposed in the sealed space, and
   a plurality of electrodes disposed on the package;
   a heat dissipating plate to which the light emitting device is secured;
   a holder to which the heat dissipating plate is secured, the holder including a plurality of terminals respectively connected to the electrodes of the light emitting device, and the holder defining a through hole, wherein
   the heat dissipating plate includes an exposed portion exposed from the holder when viewed from a side of the light emitting module on which the light extraction window of the light emitting device is provided, the heat dissipating plate defining a first through hole at a position overlapping with the through hole of the holder so that the through hole of the holder and the first through hole of the heat dissipating plate define a continuous screw hole for fixing the heat dissipating plate to the holder; and wherein the holder includes a plurality of wires and a connector, one end of each of the wires being constituted by a corresponding one of the terminals of the holder and the other end of each of the wires being disposed at the connector, and the through hole of the holder is disposed at a position between the connecter and the light emitting device when viewed from the side of the light emitting module on which the light extraction window of the light emitting device is provided.

2. The light emitting module according to claim 1, wherein
   the heat dissipating plate defines a second through hole in the exposed portion.

3. The light emitting module according to claim 2, wherein
   the exposed portion of the heat dissipating plate includes a first region and a second region separated by the holder when viewed from the side of the light emitting module on which the light extraction window of the light emitting device is provided.

4. The light emitting module according to claim 3, wherein
   the heat dissipating plate defines the second through hole and a third through hole in each of the first region and the second region of the exposed portion.

5. The light emitting module according to claim 1, wherein
   the holder includes a plurality of wires and a connector, one end of each of the wires being constituted by a corresponding one of the terminals of the holder and the other end of each of the wires being disposed at the connector, and
   the through hole of the holder being disposed in a region surrounded by the wires and the light emitting device.

6. The light emitting module according to claim 5, wherein
   the connector defines an open space that opens at a side of the holder opposite to a side on which the light emitting device is disposed with respect to a direction vertical to a direction in which light emitted from the light emitting element passes the light extraction window.

7. The light emitting module according to claim 1, wherein
   when viewed from the side of the light emitting module on which the light extraction window of the light emitting device is provided,
   a total length of the heat dissipating plate along a first direction, which is perpendicular to a second direction along which the light emitting device and the through hole of the holder are aligned, is longer than the total length of the heat dissipating plate along the second direction,
   a total length of the holder along the second direction is longer than the total length of the heat dissipating plate along the second direction.

8. The light emitting module according to claim 1, wherein
   the holder includes a body defining an opening or a recess when viewed from the side of the light emitting module on which the light extraction window of the light emitting device is provided, and
   the light emitting device is disposed within the opening or the recess with the package of the light emitting device being spaced apart from the body.

9. The light emitting module according to claim 8, wherein
   in a direction in which light emitted from the light emitting element passes the light extraction window, a height of an uppermost portion of the plurality of the terminals located on the light emitting device is different from a height of an uppermost portion of the heat dissipating plate when viewed from a side of the light emitting module.

10. The light emitting module according to claim 1, wherein
the through hole of the holder is disposed at a position spaced apart from the recess or the opening on a side of the light emitting device opposite to the exposed portion of the heat dissipating plate.

11. A light emitting module comprising:
a light emitting device including
a package defining a sealed space, and provided with a light extraction window,
a light emitting element disposed in the sealed space, and
a plurality of electrodes disposed on the package;
a heat dissipating plate having an upper face to which the light emitting device is secured;
a holder having a lower face to which the heat dissipating plate is secured, the holder including a plurality of terminals respectively connected to the electrodes of the light emitting device, and the holder defining a through hole, wherein
the heat dissipating plate includes an exposed portion exposed from the holder in a top plan view, the heat dissipating plate defining a first through hole at a position overlapping with the through hole of the holder so that the through hole of the holder and the first through hole of the heat dissipating plate define a continuous screw hole for fixing the heat dissipating plate to the holder; and wherein the holder includes a plurality of wires and a connector, one end of each of the wires being constituted by a corresponding one of the terminals of the holder and the other end of each of the wires being disposed at the connector, and
the through hole of the holder is disposed at a position between the connecter and the light emitting device in the top plan view.

12. The light emitting module according to claim 11, wherein
the heat dissipating plate defines a second through hole in the exposed portion.

13. The light emitting module according to claim 12, wherein
the exposed portion of the heat dissipating plate includes a first region and a second region separated by the holder in the top plan view.

14. The light emitting module according to claim 13, wherein
the heat dissipating plate defines the second through hole and a third through hole in each of the first region and the second region of the exposed portion.

15. The light emitting module according to claim 11, wherein
the holder includes a plurality of wires and a connector, one end of each of the wires being constituted by a corresponding one of the terminals of the holder and the other end of each of the wires being disposed at the connector, and
the through hole of the holder being disposed in a region surrounded by the wires and the light emitting device.

16. The light emitting module according to claim 11, wherein
in the top plan view,
a total length of the heat dissipating plate along a first direction, which is perpendicular to a second direction along which the light emitting device and the through hole of the holder are aligned, is longer than the total length of the heat dissipating plate along the second direction,
a total length of the holder along the second direction is longer than the total length of the heat dissipating plate along the second direction.

17. The light emitting module according to claim 11, wherein
the holder includes a body defining an opening or a recess in the top plan view,
the light emitting device is disposed within the opening or the recess with the package of the light emitting device being spaced apart from the body.

18. The light emitting module according to claim 17, wherein
an area of the opening or the recess is greater than an area of the light extraction window in the top plan view.

19. The light emitting module according to claim 11, wherein
a number of the plurality of the electrodes is four or more,
a number of the plurality of the terminals is four or more, and
each of the electrodes is directly connected to a respective one of the terminals.

20. The light emitting module according to claim 11, wherein
the through hole of the holder is disposed at a position spaced apart from the recess or the opening on a side of the light emitting device opposite to the exposed portion of the heat dissipating plate.

* * * * *